United States Patent [19]

Cho et al.

[11] 4,111,725

[45] Sep. 5, 1978

[54] SELECTIVE LIFT-OFF TECHNIQUE FOR FABRICATING GAAS FETS

[75] Inventors: Alfred Yi Cho, Summit; James Vincent DiLorenzo, Piscataway; Gerard Edward Mahoney, Branchburg, all of N.J.

[73] Assignee: Bell Telephone Laboratories, Incorporated, Murray Hill, N.J.

[21] Appl. No.: 794,336

[22] Filed: May 6, 1977

[51] Int. Cl.$^2$ .................... H01L 21/20; H01L 21/306
[52] U.S. Cl. ...................................... 148/175; 29/571;
  29/578; 29/580; 148/174; 156/612; 156/650;
  156/653; 156/657; 156/662; 357/15; 357/22;
  357/23; 357/56; 357/59; 357/61
[58] Field of Search .................. 148/174, 175; 29/571,
  29/578, 580; 156/650, 651, 653, 655, 657, 662,
  612; 357/15, 22, 23, 56, 59

[56] References Cited

U.S. PATENT DOCUMENTS

| 3,326,729 | 6/1967 | Sigler ............................. 156/657 X |
| 3,490,943 | 1/1970 | Dewerdt .......................... 156/655 X |
| 3,514,845 | 6/1970 | Legat et al. ..................... 148/175 X |
| 3,567,508 | 3/1971 | Cox et al. ........................ 29/578 X |
| 3,609,477 | 9/1971 | Drangeid et al. ................. 357/22 X |
| 3,698,947 | 10/1972 | Kemlage et al. ................ 156/657 X |
| 3,721,592 | 3/1973 | Dewerdt ............................. 156/656 |
| 3,740,835 | 6/1973 | Duncan ................................ 29/578 |
| 3,808,069 | 4/1974 | Caffrey et al. ................... 156/657 X |
| 3,912,546 | 10/1975 | Hunsperger et al. .............. 357/23 X |
| 3,928,092 | 12/1975 | Ballamy et al. ...................... 148/175 |

OTHER PUBLICATIONS

Mehal et al. "GaAs Integrated Microwave Circuits", IEEE J. Solid State Circuits, vol. SC-3, No. 2, Jun. 1968, pp. 113-116.

Joshi et al., "Integrated Circuit Fabrication Process", I.B.M. Tech. Discl. Bull., vol. 18, No. 6, Nov. 1975, pp. 1766-1767.

*Primary Examiner*—L. Dewayne Rutledge
*Assistant Examiner*—W.G. Saba
*Attorney, Agent, or Firm*—Michael J. Urbano

[57] ABSTRACT

MBE growth of epitaxial layers on selected areas of a growth surface (e.g., wafer or epi-layer grown thereon) is achieved by masking portions of the surface with an amorphous material and directing molecular beams at the masked surface so that a polycrystalline layer deposits on the mask and an epi-layer grows in the unmasked zones. The mask material is then exposed to a suitable etchant effective to dissolve that material, lift-off the polycrystalline layer and expose the underlying surface. Self-aligned contacts can be fabricated by depositing a metal layer prior to etching. Subsequent lift-off removes both the polycrystalline layer and the overlying metal. This process can be utilized in the fabrication of FETs and opto-electronic devices such as double heterostructure junction lasers.

2 Claims, 10 Drawing Figures

SELECTIVE LIFT-OFF TECHNIQUE FOR FABRICATING GAAS FETS

BACKGROUND OF THE INVENTION

This invention relates to molecular beam epitaxy (MBE) and, more particularly, to a technique for localizing MBE growth to selected areas.

GaAs planar technology, as described by A. Y. Cho and W. Ballamy in U.S. Pat. No. 3,928,092 issued on Dec. 23, 1975, involves molecular beam deposition on a GaAs wafer covered by an apertured mask of an amorphous material such as $SiO_2$. Semi-insulating polycrystalline GaAs deposits on the mask and simultaneously monocrystalline GaAs grows in the apertures (windows). Thus, monocrystalline and polycrystalline GaAs are selectively deposited on the wafer producing a planar pattern which consists of areas of electrically active devices (the monocrystalline zones) separated by semi-insulating polycrystalline GaAs.

Due to rapid innovation in microwave and optoelectronic technologies, there is a need for growing semiconductor materials on selected areas of a wafer or other growth surface. For instance, highly doped GaAs is desirable for the ohmic contact areas of a field effect transistor (FET), and $Al_xGa_{1-x}As$ is needed on the sidewalls of a GaAs junction laser in order to have two-dimensional optical confinement (i.e., a buried heterostructure).

SUMMARY OF THE INVENTION

Accordingly, our invention is a technique for effecting MBE layer growth on selected areas of a growth surface. A feature of our invention combines a unique lift-off procedure and the simultaneous codeposition of monocrystalline and polycrystalline semiconductor material. More specifically, a monocrystalline growth surface (e.g., a GaAs wafer or epi-layer thereon) is masked with a suitable amorphous layer such as $SiO_2$ or $Si_3N_4$. Windows are opened in the mask to expose the underlying growth surface where epitaxial growth is desired. Then, using MBE techniques, a molecular beam of semiconductor species is directed at the masked surface so that a monocrystalline semiconductor layer(s) grows in the windows and a polycrystalline semiconductor layer(s) deposits on the mask. Optionally, a metallic contact layer(s) may be deposited on the semiconductor layers. Subsequent exposure to a suitable etchant causes the mask to dissolve and the polycrystalline layer(s) to lift-off. If the metal contact layer is also present, the portion overlying the mask would also lift-off, leaving behind self-aligned contacts on the monocrystalline areas.

This process has been utilized in the MBE growth of highly doped epitaxial GaAs layers on selected areas of a GaAs substrate. We expect this technique to be useful in the fabrication of drain and source contacts of an FET. We further expect it to be useful to grow $Al_xGa_{1-x}As$ for optoelectronic devices and to fabricate monolithic stripe geometry GaAs—$Al_xGa_{1-x}As$ heterostructure lasers with self-aligned contacts on selected areas of a wafer.

BRIEF DESCRIPTION OF THE DRAWING

Our invention, together with its various features and advantages, can be readily understood from the following more detailed description taken in conjunction with the accompanying drawing, in which:

FIGS. 4A–5A correspond to FIGS. 4–5, respectively, except that a metal layer has been deposited so that self-aligned contacts are formed upon lift-off;

DETAILED DESCRIPTION

Before discussing specific illustrative embodiments of our invention, it will be helpful to review the general procedure. Using molecular beam techniques of the type described in U.S. Pat. No. 3,928,092, we deposit an amorphous layer on a semiconductor wafer body, e.g., on a chemically etched substrate or on an epitaxial layer grown on the wafer. Standard photolithographic or other patterning procedures are used to open windows in selected portions of the amorphous layer. The wafer is then mounted in an ultrahigh vacuum chamber and the background pressure is reduced to typically $10^{-8}$ to $10^{-9}$ torr. With the substrate heated to a suitable deposition temperature, molecular beams are directed at the masked surface to effect simultaneously the growth of a monocrystalline layer in the windows and a polycrystalline layer on the remaining portions of the amorphous layer. A suitable etchant is then applied to the amorphous layer causing it to dissolve and lift off the polycrystalline layer. Growth of monocrystalline (epitaxial) semiconductor material is thus effected on selected regions of the wafer, i.e., in the windows of the mask.

In an alternative embodiment, prior to lift-off a metal layer may be formed over both the monocrystalline and polycrystalline layers. Subsequent lift-off removes both the polycrystalline layer and the overlying portion of the metal layer, leaving self-aligned metal contacts on the monocrystalline layers.

These generalized embodiments of our invention are described hereinafter with reference to the fabrication of a field effect transistor and monolithic double heterostructure junction lasers.

FET FABRICATION

A high power GaAs FET proposed by Fukuta et al., *IEEE Transactions on Microwave Theory and Techniques,* Vol. MTT-24, pp. 312, 1976, comprises epitaxial inlays which form $n^+$-GaAs drain and source regions to achieve a high drain-to-source breakdown voltage, thus resulting in higher output power.

Figure 1:
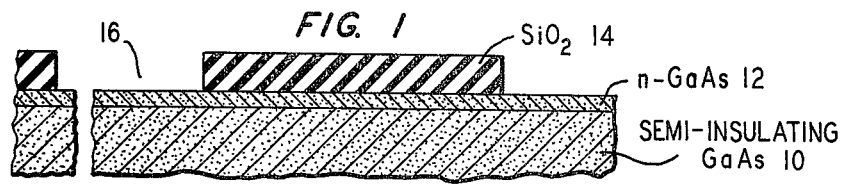
FIGS. 1–5 show cross-sectional views of a semiconductor device at various stages of processing in accordance with one embodiment of our invention.

We fabricated the inlaid source and drain contacts of this structure as follows. With reference to FIGS. 1–5, an epitaxial n-type GaAs layer 12 doped to a carrier concentration of about $6 \times 10^{16}$ cm$^{-3}$ to $1.2 \times 10^{17}$ cm$^{-3}$ was grown about 2500 to 5000 Angstroms thick on a semi-insulating GaAs wafer or substrate 10 (e.g., a Cr doped substrate having resistivity of about $10^7$ ohm-cm). Layer 12 is typically doped with S when grown by CVD or with Sn when grown by MBE. In addition to using standard MBE practices (e.g., proper substrate surface preparation prior to mounting in the MBE chamber; pre-heating in the chamber under excess As pressure; background pressures of $10^{-8}$ to $10^{-9}$ torr), we exercised care to avoid surface segregation of the Sn dopant by maintaining the substrate temperature less than 550° C. as described in U.S. Pat. No. 3,941,624. Then the wafer was removed from the MBE chamber and a thick amorphous layer 14 (i.e., $SiO_2$, 7000 Angstroms thick) was deposited on the substrate 10 using standard SILOX techniques. Patterns were formed in the $SiO_2$ with conventional photolithographic techniques and subsequent plasma etching was used to remove the $SiO_2$ in the photoresist windows 16. FIG. 1 shows a cross-section of a (110) plane of an (001) GaAs substrate processed up to this point.

Figure 2:
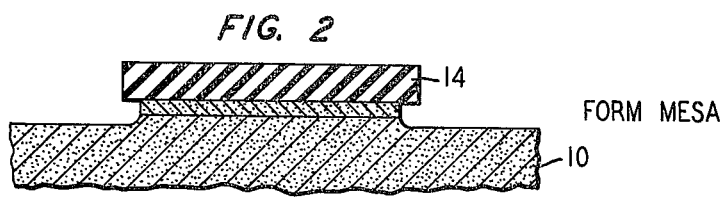

An etchant was then applied to form mesas of the type shown in FIG. 2. In particular an etchant of $H_2O_2$ and $NH_4OH$ was used at an etch rate which was about 400 Angstroms/min at room temperature. GaAs was removed from areas not protected by $SiO_2$ mask layer 14 (i.e., in the windows) to a depth which exceeded the thickness of the epitaxial layer 12, e. g., to a depth of 3000 Angstroms for a layer 2500 Angstroms thick. This step resulted in an undercut structure shown in FIG. 2 having a mesa about 3–8$\mu$m wide. Smaller width mesas are generally used for low noise FETS whereas the larger dimension is used for high power applications. Anodization is another procedure suitable to form the mesa.

Figure 3:
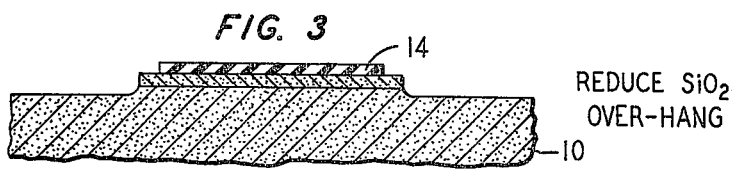

In order to grow GaAs by MBE in the etched hole between mesas without any void between the grown layer and the mesa, the overhang portion of the $SiO_2$ mask has to be removed. The removal of the $SiO_2$ overhang was accomplished by etching in HF diluted in $H_2O$ to 20:1 (for about 95 seconds). As illustrated in FIG. 3 the $SiO_2$ layer was reduced in the vertical dimension as well as in the lateral dimension by about 4000 Angstroms.

Figure 4:
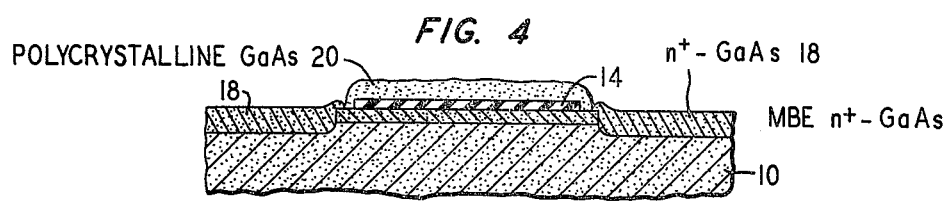
Figure 5:
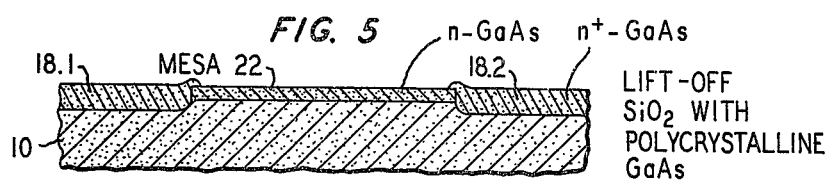

The wafer was then remounted in the MBE growth chamber and $n^+$-GaAs was deposited taking care, as before, to avoid surface segregation of the Sn dopant. As shown in FIG. 4, this step resulted in monocrystalline layers 18 of $n^+$GaAs being grown in the windows on the substrate 10 and a polycrystalline GaAs layer 20 being grown on the $SiO_2$ mask 14. Careful investigation showed that the thick polycrystalline layer 20 spilled over the edge of $SiO_2$ layer 14 as exaggerated in FIG. 4.

The wafer was then removed from the growth chamber and exposed to an HF acid followed by acetone spray which caused the $SiO_2$ mask to dissolve and the polycrystalline GaAs layer 20 to lift off. The resulting structure shown in FIG. 5 comprised an n-GaAs mesa 22 bounded laterally by $n^+$-GaAs epitaxial layers 18.1 and 18.2. FET layers 18.1 and 18.2 serve as the source and drain whereas the mesa 22 serves as the gate or channel.

Figure 4A:
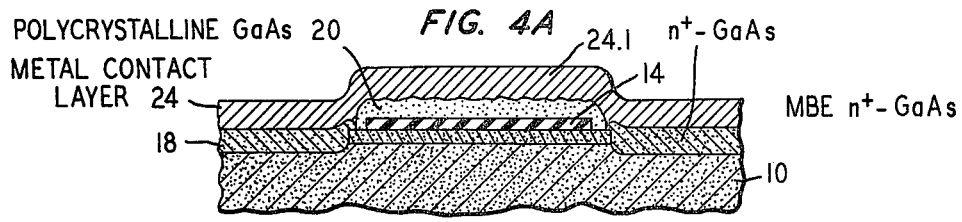
Figure 5A:
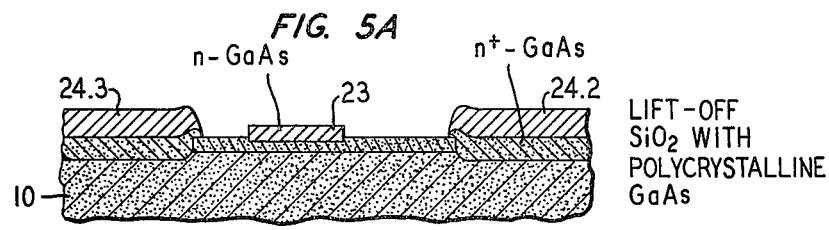

Although metal electrodes to the source, drain, and gate can be formed by standard photolithographic and metal deposition techniques, metallization can be supplied as shown in FIG. 4A by evaporating or otherwise depositing a metal contact layer 24 over the wafer (i.e., over the epitaxial layers 18 and the polycrystalline layer 20) before the lift-off step. Subsequent lift-off of the polycrystalline layer 20 causes the overlying portion 24.1 of the metal layer to also be removed. The resultant structure shown in FIG. 5A has self-aligned source and drain electrodes 24.2 and 24.3. The gate electrode 23 can be formed on mesa 22, or in a recess in the mesa, using photolithographic and etching techniques. For the parameters previously given, the gate electrode is typically 0.5 to 2.0 $\mu$m long and is positioned nearer the source than the drain.

LASER FABRICATION

Figure 6:
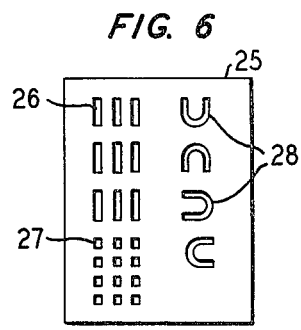
FIG. 6 is a top view of patterned mask useful in explaining how our technique can be applied to optoelectronic devices.

The foregoing lift-off technique can be utilized in the fabrication of monolithic double heterostructure lasers as follows. An amorphous layer 25 (FIG. 6) is deposited on a monocrystalline wafer of GaAs, for example, and the active device shapes and locations are then defined by forming patterns in the amorphous layer with conventional photolithographic techniques. Subsequent removal of the amorphous layer in the photoresist windows results in exposing the underlying substrate in various geometric shapes. As shown in FIG. 6, some of these shapes include rectangles 26, square dots 27, and U-shaped segments 28.

Take, for example, the case of rectangular windows 26 which can be used to fabricate a plurality of stripe geometry, double heterostructure junction lasers. The masked wafer is placed in an MBE growth chamber and the conventional layers of a double heterostructure are deposited. These layers include a pair of wide bandgap, opposite conductivity type cladding layers which are separated by and contiguous with a narrower bandgap active region. The latter may be n-type or p-type or both as in the case where the p-n junction is intermediate the active region. Group III(a)–V(a) compound materials are particularly suited for use in such lasers. The most common material used for the active region is $Al_xGa_{1-x}R$ where $0 \leq x \lesssim 0.4$, R includes at least As and may include P or Sb. The cladding layers similarly comprise $Al_yGa_{1-y}R$ and $Al_zGa_{1-z}R$, where $0 \leq y,z \leq 1$ and $y,z > x$. However, GaAsSb is also an appropriate material. Other variants of heterostructure lasers are also contemplated within the scope of our invention.

Figure 7:
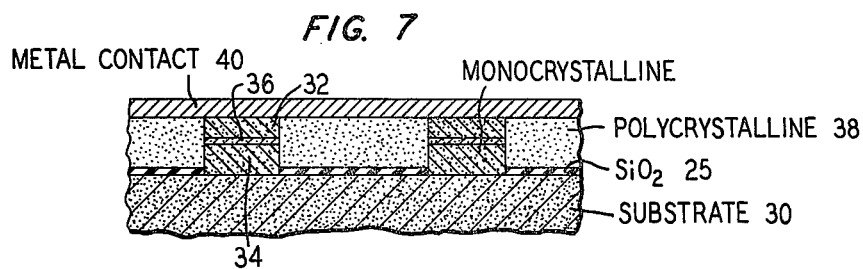
FIGS. 7 and 8 are cross-sectional views of double heterostructure lasers with self-aligned contacts processed according to the general procedure illustrated by FIGS. 1–3 and 4A–5A.
Figure 8:
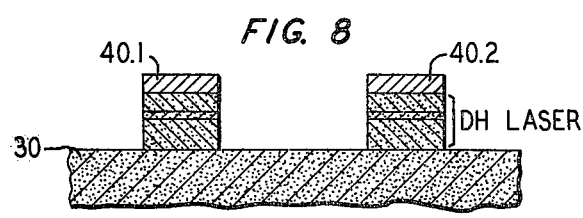

FIG. 7 shows a plurality of double heterostructure lasers fabricated on a substrate 30 in the rectangular windows of an $SiO_2$ mask layer 29. Monocrystalline layers forming the laser (cladding layers 32 and 34 and active region 36) grow epitaxially in the rectangular windows whereas polycrystalline layers 38 deposit on the $SiO_2$ layer 29. A metal contact 40 is then deposited over the entire top surface of the wafer. Dissolving the $SiO_2$ layer 29 with an HF acid followed by an acetone spray results in lift-off of all the material above the $SiO_2$. The remaining structures are stripe geometry, double heterostructure lasers with self-aligned metal contacts 40.1 and 40.2 as shown in FIG. 8. Modulators, waveguides, and other optoelectronic devices can be fabricated in a similar fashion.

It is to be understood that the above-described arrangements are merely illustrative of the many possible specific embodiments which can be devised to represent application of the principles of our invention. Numerous and varied other arrangements, such as Group III–V integrated circuits, can be devised in accordance with these principles by those skilled in the art without departing from the spirit and scope of the invention. In particular, we found that the use of an $SiO_2$ mask did not result in ideal source-drain I–V characteristics probably because Ga diffused through the mask and degraded the doping profiles. However, the use of $Si_3N_4$ as a mask significantly reduced such degradation. More specifically, the $Si_3N_4$ was deposited by using an RF plasma while holding the substrate at about 350° C. (at lower temperatures around 270° C. the nitride layer exhibiting cracking). After masking the nitride layer, windows were opened using plasma flourine etching to form mesas capped by nitride. Then the nitride overhanging the mesa was eliminated by etching in either plasma flourine or other suitable nitride etchant. MBE was used to deposit 3500 Angstroms of GaAs, epitaxial in the windows and polycrystalline on the nitride. By exposing the nitride to concentrated HF, the polycrystalline layer was lifted off to expose the underlying substrate (actually an epi-layer on the substrate). Contacts to the MBE selective epi-layers formed the source and drain electrodes. The source-drain I-V characteristics, although not ideal, were significantly improved relative to I-V characteristics obtained using $SiO_2$ masks.

Finally, while our invention has been illustratively described with respect to MBE growth of GaAs and AlGaAs on selected areas, it should be apparent that other Group III(a)–V(a) or Group II–VI materials, which have been grown by MBE in the prior art, are also suitable in conjunction with appropriate amorphous mask materials which, first, permit codeposition of monocrystalline and polycrystalline material and, second, can be dissolved to effect lift-off.

What is claimed is:

1. A process for fabricating a field effect transistor comprising steps of:
    (a) growing a first GaAs epitaxial layer on a major surface of a semi-insulating GaAs wafer,
    (b) forming on said first epitaxial layer an amorphous layer selected from group consisting of $SiO_2$ and $Si_3N_4$,
    (c) opening windows in said amorphous layer to expose as source and drain regions underlying portions of said first epitaxial layer,
    (d) forming mesas under said amorphous layer by subjecting the exposed portions of said first epitaxial layer to an etchant or anodization, said mesas extending to a depth greater than the thickness of said first epitaxial layer and undercutting the edges of said amorphous layer,
    (e) reducing the size of said amorphous layer so as to eliminate the portions which overhang said mesas,
    (f) placing said wafer in an ultra high vacuum chamber and heating said wafer to a temperature suitable for molecular beam deposition,
    (g) directing molecular beams of Ga, As and a dopant at said wafer to grow GaAs epitaxial second layers in said windows and a polycrystalline GaAs layer on said amorphous layer,
    (h) subjecting said amorphous layer to an etchant effective to dissolve said amorphous layer and lift off said polycrystalline layer, thereby exposing said mesas but leaving unaffected said second epitaxial layers which laterally bound said mesas and form source and drain regions, said mesa forming a gate region, and
    (i) forming electrodes on said source, drain, and gate regions.

2. The process of claim 1 wherein the forming of electrodes includes between steps (g) and (h) the additional step of depositing a metallic layer on said epitaxial layers and said polycrystalline layer, said subjecting step (h) being effective to lift off both said polycrystalline layers and the overlying portions of said metallic layer, thereby to leave on said second epitaxial layers self-aligned metallic contacts, and forming metallic gate electrodes to said mesas exposed by said lift-off.

* * * * *